United States Patent
Ko et al.

(10) Patent No.: US 8,536,064 B2
(45) Date of Patent: Sep. 17, 2013

(54) DOUBLE PATTERNING STRATEGY FOR CONTACT HOLE AND TRENCH IN PHOTOLITHOGRAPHY

(75) Inventors: Chung-Chi Ko, Nantou (TW); Chih-Hao Chen, Hsinchu (TW); Keng-Chu Lin, Chao-Chou Ping-Tung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 744 days.

(21) Appl. No.: 12/701,927

(22) Filed: Feb. 8, 2010

(65) Prior Publication Data

US 2011/0195576 A1    Aug. 11, 2011

(51) Int. Cl.
*H01L 21/302* (2006.01)

(52) U.S. Cl.
USPC .................................. 438/738; 257/E21.257

(58) Field of Classification Search
USPC .......................................... 438/738, 740, 751
See application file for complete search history.

(56) References Cited

U.S. PATENT DOCUMENTS

| | | | |
|---|---|---|---|
| 5,858,870 A | 1/1999 | Zheng et al. | |
| 6,696,222 B2 | 2/2004 | Hsue et al. | |
| 7,001,833 B2 | 2/2006 | Bao et al. | |
| 7,304,386 B2 * | 12/2007 | Kanamura | 257/759 |
| 7,540,970 B2 | 6/2009 | Koh et al. | |
| 7,871,908 B2 | 1/2011 | Yatsuda et al. | |
| 2003/0059720 A1 | 3/2003 | Hwang et al. | |
| 2004/0175932 A1 | 9/2004 | Kim et al. | |
| 2006/0189051 A1 | 8/2006 | Kim | |
| 2007/0013069 A1 * | 1/2007 | Tada et al. | 257/758 |
| 2007/0045861 A1 * | 3/2007 | Ohto et al. | 257/774 |
| 2007/0125750 A1 | 6/2007 | Weng et al. | |
| 2007/0197014 A1 | 8/2007 | Jeon et al. | |
| 2007/0231750 A1 | 10/2007 | Parikh | |
| 2008/0081461 A1 | 4/2008 | Lee et al. | |
| 2009/0081864 A1 | 3/2009 | Matz et al. | |
| 2010/0193919 A1 | 8/2010 | Warrick et al. | |

* cited by examiner

*Primary Examiner* — Charles Garber
*Assistant Examiner* — Reema Patel
(74) *Attorney, Agent, or Firm* — Slater & Matsil, L.L.P.

(57) ABSTRACT

A method of lithography patterning includes forming a first etch stop layer, a second etch stop layer, and a hard mask layer on a material layer. The materials of the first etch stop layer and the second etch stop layer are selected by the way that there is a material gradient composition between the second etch stop layer, the first etch stop layer, and the material layer. Hence, gradient etching rates between the second etch stop layer, the first etch stop layer, and the material layer are achieved in an etching process to form etched patterns with smooth and/or vertical sidewalls within the second and the first etch stop layers and the material layer.

18 Claims, 6 Drawing Sheets

DOUBLE PATTERNING STRATEGY FOR CONTACT HOLE AND TRENCH IN PHOTOLITHOGRAPHY

CROSS REFERENCE

The present disclosure is related to the following commonly-assigned U.S. Provisional Patent Application, the entire disclosure of which is incorporated herein by reference: U.S. Provisional Application No. 61/245,447; for "DOUBLE PATTERNING STRATEGY FOR CONTACT HOLE AND TRENCH IN PHOTOLITHOGRAPHY".

BACKGROUND

Semiconductor technologies are continually progressing to smaller feature sizes, for example down to feature sizes of 65 nanometers, 45 nanometers, and below. A patterned photoresist (resist) layer used to produce such small feature sizes typically has a high aspect ratio. Maintaining a desired critical dimension (CD) can be very difficult for various reasons, especially for a resist layer with a high aspect ratio. The double patterning processes have been introduced to form various features with smaller dimensions. However, conventional double patterning processes involve multiple etching processes with high manufacturing cost and low throughput.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
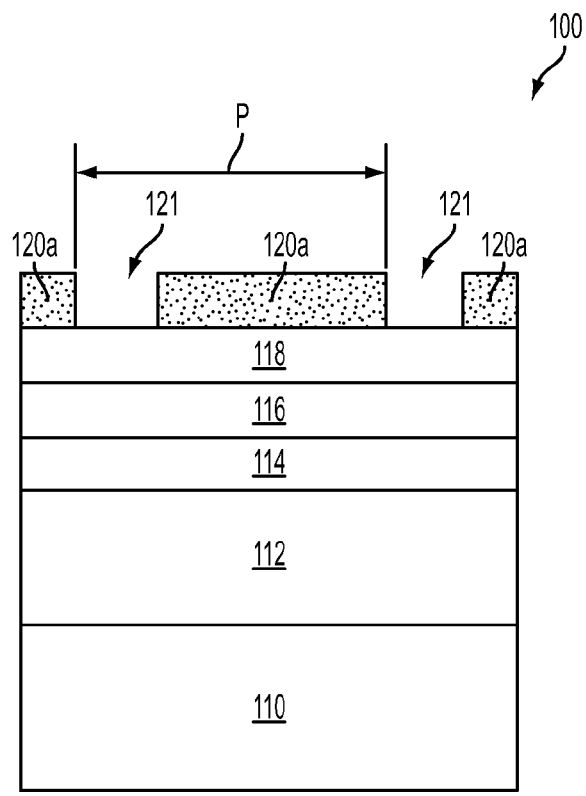
FIGS. 1 through 9 are sectional views of one embodiment of a semiconductor device during various fabrication stages.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 10:
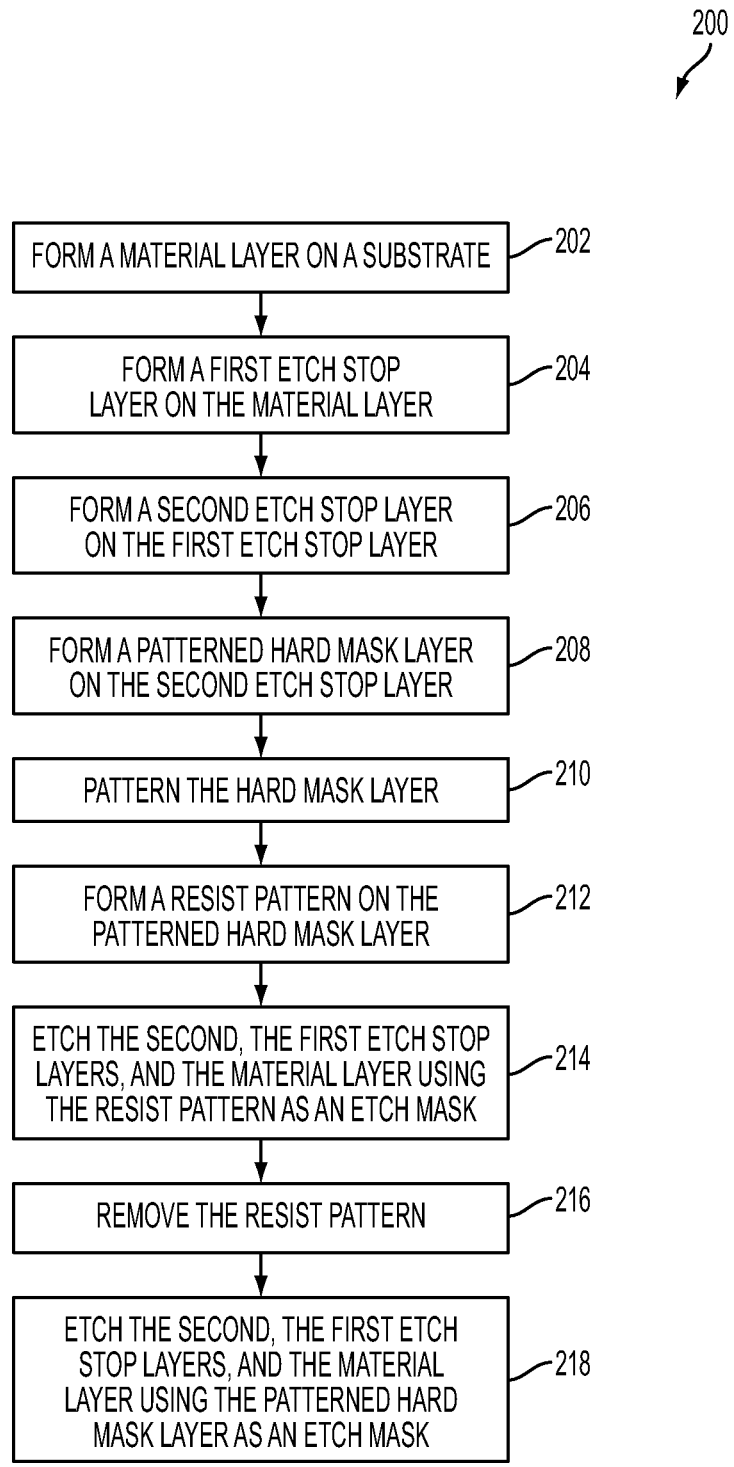
FIG. 10 is a flowchart showing one embodiment of a lithography patterning method.

Referring to FIGS. 1 and 10, the method 200 may begin at step 202 by forming one or more underlying material layer (also referred to as an "under-material" layer) on a substrate 110. The substrate 110 may be made of silicon, some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 110 may include a non-semiconductor material such as a glass for thin-film-transistor liquid crystal display (TFT-LCD) devices, or fused quartz or calcium fluoride for a photomask (mask). The substrate 110 may include various doped regions, dielectric features, and multilevel interconnects. In one embodiment, the substrate 110 includes various doped features for various microelectronic components, such as a complementary metal-oxide-semiconductor field-effect transistor (CMOSFET), imaging sensor, memory cell, and/or capacitive element. In another embodiment, the substrate 110 includes conductive material features and dielectric material features configured for coupling and isolating various microelectronic components, respectively. In another embodiment, the substrate 110 includes one or more material layers formed thereon.

The under-material layer may be a single material or layers of different materials. In the embodiment shown in FIGS. 1-10, a material layer 112 is formed on the substrate 110. The material layer 112, in one embodiment, may be a dielectric material used for ILD or IMD including silicon oxide and low-k dielectric materials with a dielectric constant less than about 4. The material layer 112, in another embodiment, may be a silicon, polysilicon, metal materials or combinations thereof used for electrode gate. In the present embodiment, the material layer 112 is a low-k dielectric layer. Suitable low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other proper porous polymeric materials. The dielectric material may be formed by a suitable process including spin-on coating or chemical vapor deposition (CVD). The material layer 112, for example, may have a thickness ranging from about 500 angstroms to about 5000 angstroms.

Still referring to FIGS. 1 and 10, the method 200 proceeds to step 204 by forming a first etch stop layer 114 on the material layer 112. In one embodiment, the first etch stop layer 114 is an oxide layer including oxycarbide (SiOC), silicon oxide (SiO2), TEOS, silicon oxide and carbon-doped oxide, or other suitable material film formed by a suitable process, such as CVD or PVD deposition. The first etch stop layer 114 may have a thickness ranging from about 30 angstroms to about 500 angstroms.

Still referring to FIGS. 1 and 10, the method 200 proceeds to step 206 by forming a second etch stop layer 116 on the first etch stop layer 114. The second etch stop layer 116, in one embodiment, is an oxide layer including oxycarbide (SiOC), silicon oxide (SiO2), TEOS, silicon oxide and carbon-doped oxide, or other suitable material film formed by a suitable process, such as CVD or PVD deposition. The second etch stop layer 116 may have a thickness ranging from about 50 angstroms to about 1000 angstroms.

According to one aspect of the present embodiment, there is a material gradient composition between the second etch stop layer 116, the first etch stop layer 114, and the material layer 112. For example, the carbon concentration of the first etch stop layer 114 is between the carbon concentrations of the second etch stop layer 116 and the material layer 112. In one embodiment, the carbon concentration of the first etch stop layer 114 is greater than the carbon concentration of the second etch stop layer 116, but less than the carbon concentration of the material layer 112. For example, the carbon concentrations of the material layer 112, the first etch stop layer 114, and the second etch stop layer 116 are larger than about 15%, ranging from about 5% to about 15%, and less than about 5%, respectively. In another embodiment, the carbon concentration of the first etch stop layer 114 is less than the carbon concentration of the second etch stop layer 116, but greater than the carbon concentration of the material layer 112. For example, the carbon concentrations of the material layer 112, the first etch stop layer 114, and the second etch stop layer 116 are less than about 15%, ranging from about 15% to about 25%, and larger than about 25%, respectively.

Alternatively, there may be gradient silicon concentrations between the material layer 112, the first etch stop layer 114, and the second etch stop layer 116. In one embodiment, the silicon concentration of the first etch stop layer 114 is greater than the silicon concentration of the second etch stop layer 116, but less than the silicon concentration of the material layer 112. For example, the silicon concentrations of the material layer 112, the first etch stop layer 114, and the second etch stop layer 116 are larger than about 42%, ranging from about 42% to about 30%, and less than about 30%, respectively. In another embodiment, the silicon concentration of the first etch stop layer 114 is less than the silicon concentration of the second etch stop layer 116, but greater than the silicon concentration of the material layer 112. For example, the silicon concentrations of the material layer 112, the first etch stop layer 114, and the second etch stop layer 116 are less than about 42%, ranging from about 42% to about 55%, and larger than about 55%, respectively.

Referring to FIG. 10, the method 200 proceeds to step 208 by forming a hard mask layer 118 on the second etch stop layer 116. In one embodiment, the hard mask layer 118 is a nitride layer or a carbide layer, including titanium nitride, tantalum nitride, silicon nitride, silicon carbide, or other suitable material film formed by a suitable process, such as CVD or PVD deposition. The hard mask layer 118 may have a thickness ranging between about 50 angstroms and about 1000 angstroms. The hard mask layer 118 can function as a hard mask during a later etching process for patterning the material layer 112 and/or the substrate 110.

Still referring to FIG. 1, a first resist pattern, including a plurality of first resist features 120a and a plurality of first openings 121 defined by the first resist features 120a, on the hard mask layer 118. The first resist pattern, in one embodiment, is a positive tone resist (positive resist) pattern formed by exposing and developing a first positive resist layer. In another embodiment, the first resist pattern is a negative tone resist (negative resist) pattern formed by exposing and developing a first negative resist layer. Preferably, the first resist pattern is a positive resist pattern. The positive resist is characterized as that the exposed regions will be removed by the developing solution. In one embodiment, the positive resist pattern includes chemical amplifier (CA) resist. The CA resist includes photoacid generator (PAG) that can be decomposed to form acid during a lithography exposure process. More acid can be generated as a result of catalytic reaction. As one example of the formation, the first resist layer is formed on the semiconductor device 100 and then patterned by a first lithography process to form the first resist features 120a and the first openings 121 as illustrated in FIG. 1. The first lithography process uses a lithography system and a first mask.

The first resist features 120a are formed according to a predetermined integrated circuit pattern in the first mask. In one embodiment, the first resist features 120a include a pitch P, defined as a distance from one feature to adjacent feature of the first resist pattern. The pitch P may range between about 50 nm and about 200 nm. As one example, the pitch P is about 100 nm. The first resist pattern may have a thickness ranging between about 500 angstroms and about 5000 angstroms. In various examples, the first resist pattern may have a thickness ranging between about 500 angstroms and about 3000 angstroms, or between about 500 angstroms and about 1500 angstroms. The first lithography process used to form the first resist pattern may include resist coating, exposing, post-exposure baking, and developing. The first lithography process may additionally include soft baking, mask aligning, and/or hard baking. For illustration, the exposing process may be carried out by exposing the semiconductor device 100 under a radiation beam through the first mask.

Before the step of forming the first resist features 120a, an anti-reflective coating (ARC) layer (not shown) may be optionally formed on the hard mask layer 118 to reduce reflection during lithography exposing processes, also referred to as a top anti-reflective coating (TARC) layer or bottom anti-reflective coating (BARC) layer. In one example, the ARC layer may include organic BARC material formed by a spin-coating technique. The ARC layer may have a thickness ranging from about 50 angstroms to about 2000 angstroms. The ARC layer may be eliminated if the hard mask layer 118 can function as an anti-reflective layer as well.

Figure 2:
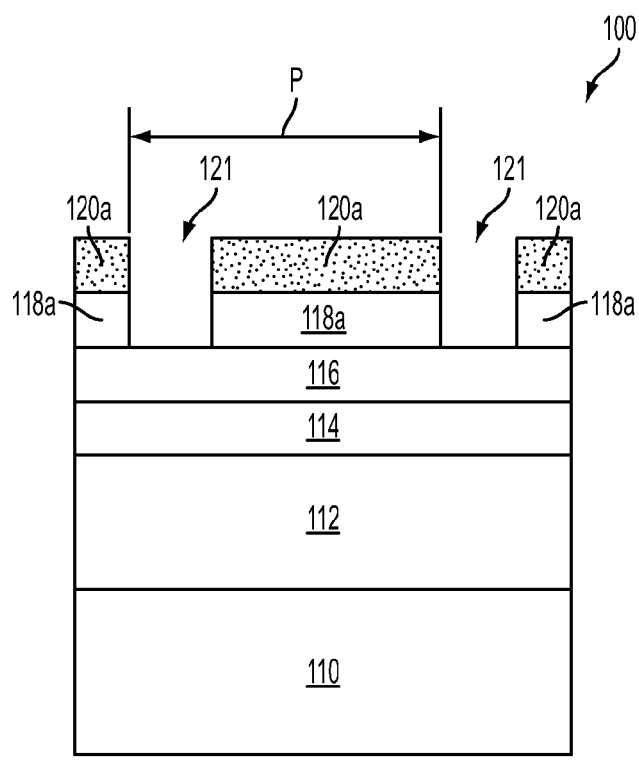

Referring to FIGS. 2 and 10, the method 200 proceeds to step 210 by patterning the hard mask layer 118. A plurality of intermediate hard mask features 118a are formed by etching the hard mask layer 118 using the first resist pattern as an etch mask. The hard mask layer 118 is partially covered by the first resist pattern and the uncovered portions of the hard mask layer 118 are removed by a first etching to form the intermediate hard mask features 118a. The step of etching could be performed by using the gas of $C_xH_yF_z$ (x, z>0, y>=0), $Cl_2$, HBr, $SF_6$, $O_2$, $N_2$, Ar, or mixtures thereof.

Figure 3:
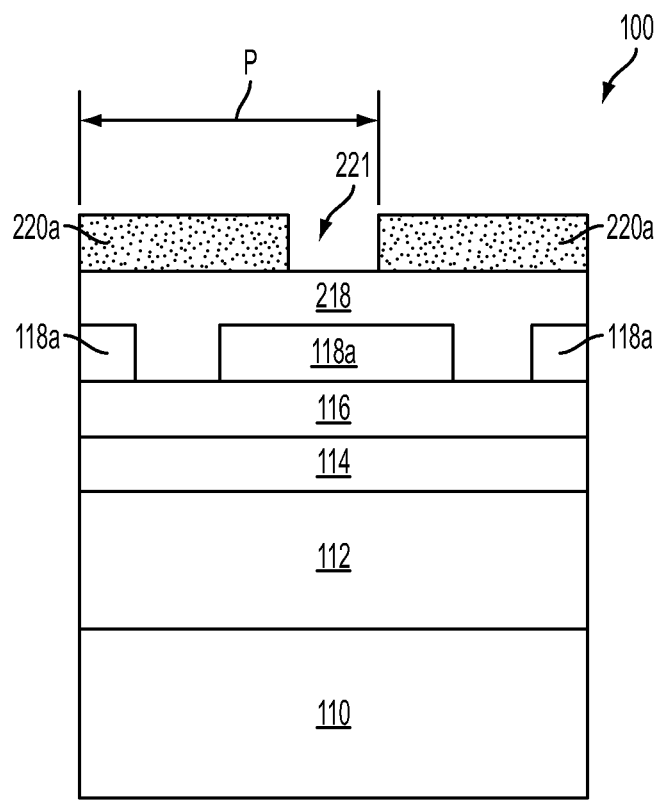

Referring to FIG. 3, the first resist features 120a may be removed by implementing a wet stripping and/or plasma ashing known in the art. For example, an oxygen plasma ashing may be implemented to remove the first resist features 120a. A second anti-reflective coating (ARC) layer 218 may be additionally formed within and above the intermediate hard mask features 118a to form a substantially smooth surface and reduce reflection during a later lithography exposing process. In one example, the second ARC layer 218 may include organic BARC material formed by a spin-coating technique. The second ARC layer 218 may have a thickness ranging from about 50 angstroms to about 2000 angstroms.

Still referring to FIG. 3, a second resist pattern, including a plurality of second resist features 220a and a plurality of second openings 221 defined by the second resist features 220a, on the second ARC layer 218. The second resist features 220a and the second openings 221 are formed by exposing and developing a second resist layer on the second ARC layer 218. In one embodiment, the second resist layer is a positive resist layer. In another embodiment, the second resist layer is a negative resist layer. Preferably, the second resist layer has the same tone as the first resist layer. The second resist layer is patterned with a second lithography process. In the second lithography process, the second resist layer is exposed by using a second mask with a second predefined pattern and a lithography system. The second lithography process may further include post-exposure baking, developing, and hard baking.

A plurality of exposed resist features and unexposed resist features are formed (not shown) in the second resist layer by the second exposing process. The exposed resist features are then removed by a subsequent developing process to form the second resist features 220a and the second openings 221. The second resist pattern may be formed to have a pitch similar to the pitch P of the first resist pattern. In one embodiment, the second resist features 220a are configured relative to the first resist features 120a to form a combined pattern in the hard mask layer 118 so to utilize a double patterning structure. For example, at least one of the second openings 220a is positioned above one of the intermediate hard mask features 118a. For example, each of the second opening 220a is positioned above each of the intermediate hard mask feature 118a. In another embodiment, the second openings 220a may be substantially aligned to central portions of the intermediate hard mask features 118a, respectively. Such that, the pitch defined by the first resist features 120a and the second resist features 220a is halved (½ P), resulting in a reduced minimum features size.

Figure 4:
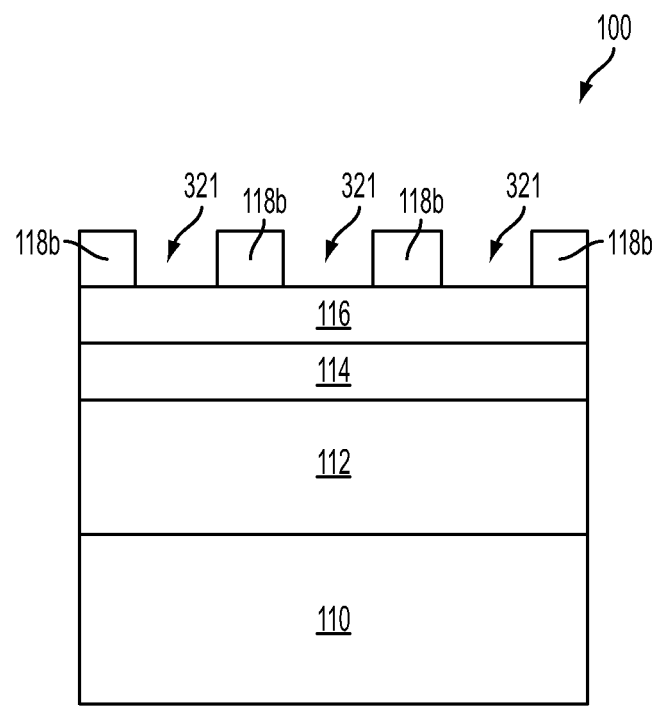

Referring to FIG. 4, a plurality of final hard mask features 118b are formed by etching the intermediate hard mask features 118a through the second ARC layer 218 using the second resist pattern as an etch mask. The second ARC layer 218 is partially uncovered by the second resist pattern and the uncovered portions of the second ARC layer 218 are removed by a second etching to expose portions of the underlying intermediate hard mask features 118a after the step of second etching. The exposed portions of the intermediate hard mask features 118a are then removed by a third etching to form the final hard mask features 118b. The second and the third etchings could be performed in a single process step or in separated process steps. The process of the third etching is chosen such that the hard mask layer 118 has an etch rate higher than the etch rate of the second etch stop layer 116. Therefore, the hard mask layer 118 within the openings 221 is substantially removed during the third etching process. The second ARC layer 218 and the intermediate hard mask features 118a can be etched by using the gas of $C_xH_yF_z$ (x, z>0, y>=0), Cl2, HBr, SF6, O2, N2, Ar, or mixtures thereof.

Still referring to FIG. 4, the second resist features 220a and the remaining second ARC layer 218 are removed by implementing a wet stripping and/or plasma ashing known in the art. For example, an oxygen plasma ashing may be implemented to remove the second resist features 220a. Additionally, the remaining second ARC layer 218 may also be simultaneously removed by the same plasma ashing process. A plurality of openings 321 are thus formed between the final hard mask features 118b. The openings 321 are used to further form various contact holes or trenches in different applications.

Figure 5:
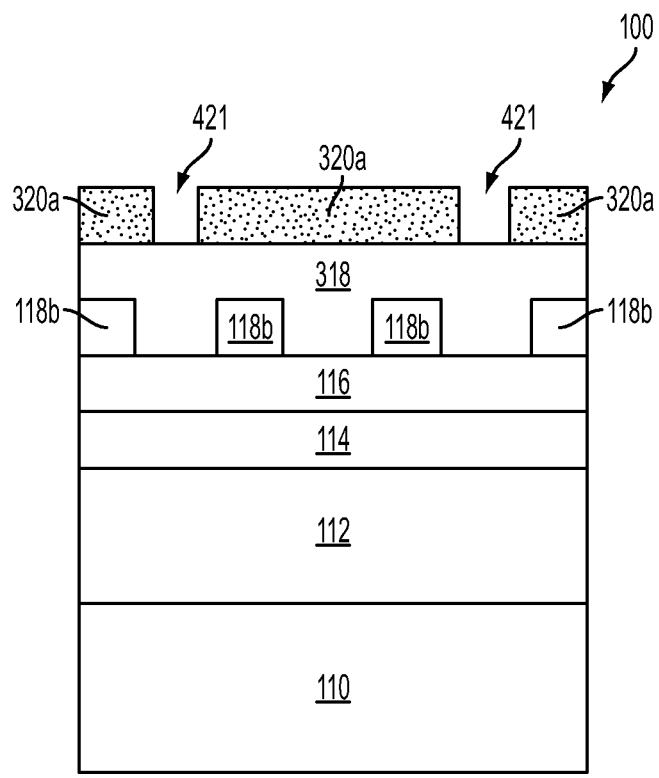

Referring to FIGS. 5 and 10, the method 200 proceeds to step 212 to form a plurality of third resist features 320a overlying the final hard mask features 118b. Before forming the third resist features 320a, a third ARC layer 318 may be optionally provided within and above the final hard mask features 118b to form a substantial smooth surface and reduce reflection during a later lithography exposing process. The third ARC layer 318 may have a thickness ranging from about 50 angstroms to about 2000 angstroms. A plurality of third openings 421 are distributed between the third resist features 320a, on the third ARC layer 318. The third resist features 320a and the third openings 421 are formed by exposing and developing a third resist layer on the third ARC layer 318. In one embodiment, the third resist layer is a positive resist layer. In another embodiment, the third resist layer is a negative resist layer. Preferably, the third resist layer has the same tone as the first resist layer. The third resist layer is patterned with a third lithography process by using a third mask with a third predefined pattern and a lithography system. The third openings 421 may have a dimension less than the first openings 121 or the second openings 221. The third openings 421 may be positioned either above the first openings 121 or above the second openings 221 to define via holes. The third lithography process may further include post-exposure baking, developing, and hard baking.

Figure 6:
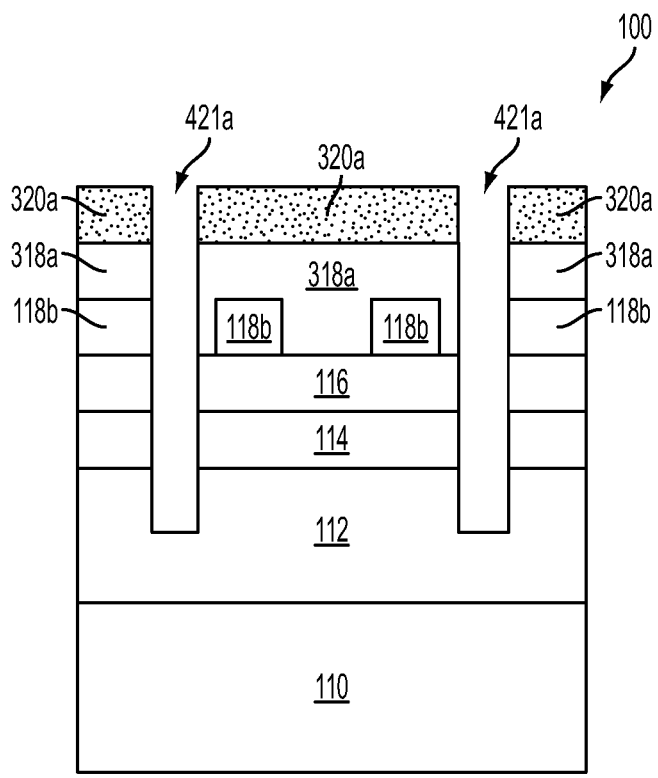

Referring to FIGS. 6 and 10, the method 200 proceeds to step 214 to form a plurality of intermediate via holes 421a in the material layer 112. The material layer 112 is partially removed through the third ARC layer 318, the second and the first etch stop layers 116, 114 by using the third resist features 320a as an etch mask. The depth of the removed material layer 112 is designed to be substantial the same as a trench line thickness in a final dual damascene structure. The unremoved portions of the material layer 112 will be removed during a later etching process. The ratio of the removing portion to the remaining portion can be ranged from about 1 to about 4. Preferably, the ratio of the removing portion to the remaining portion is 2.

The second and the first etch stop layers and the material layer 112 may be etched by using separate etching steps, or preferably, by using a single step with etching gas of $C_xH_yF_z$ (x, z>0, y>=0), CF3I, CH4, NF3, O2, N2, H2, Ar, or mixtures thereof. In one embodiment, the etching rate of the first etch stop layer 114 is between the etching rates of the second etch stop layer 116 and the material layer 112. In another embodiment, the etching rate of the first etch stop layer 114 is greater than the etching rate of the second etch stop layer 116, but less than the etching rate of the material layer 112 under the conditions that the carbon concentration of the first etch stop layer 114 is greater than the carbon concentration of the second etch stop layer 116, but less than the carbon concentration of the material layer 112 and the silicon concentration of the first etch stop layer 114 is less than the silicon concentration of the second etch stop layer 116, but greater than the silicon concentration of the material layer 112. In other embodiment, the etching rate of the first etch stop layer 114 is less than the etching rate of the second etch stop layer 116, but greater than the etching rate of the material layer 112 under the conditions that the carbon concentration of the first etch stop layer 114 is less than the carbon concentration of the second etch stop layer 116, but greater than the carbon concentration of the material layer 112 and the silicon concentration of the first etch stop layer 114 is greater than the silicon concentration of the second etch stop layer 116, but less than the silicon concentration of the material layer 112. Hence, smooth and/or vertical sidewalls in the second and the first etch stop layers and the material layer 112 could be achieved by the designed etching rates. Thereafter, referring to FIG. 11, the method 200 proceeds to step 216 to remove the third resist features 320a and the remaining third ARC layer 318a by implementing a wet stripping and/or plasma ashing known in the art.

Figure 7:
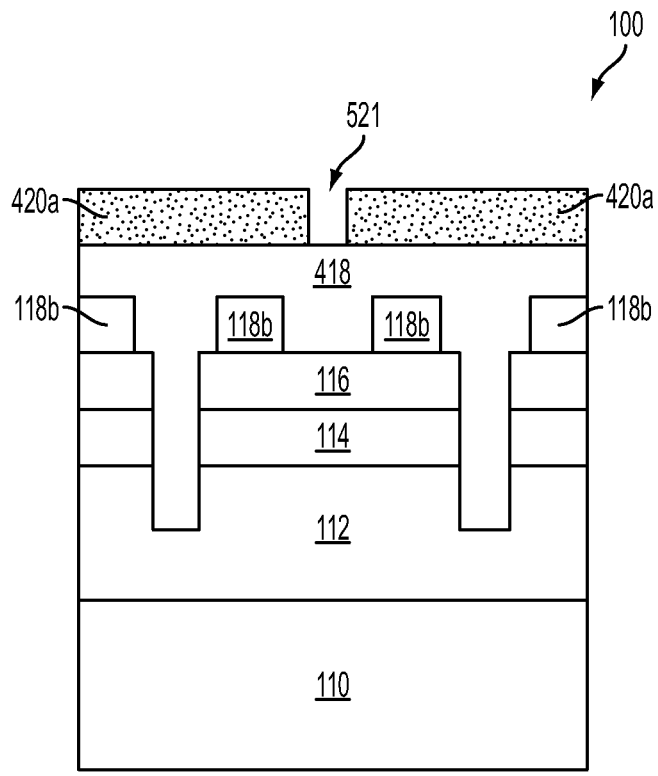

Referring to FIG. 7, a fourth resist pattern, including a plurality of fourth resist features 420a and a plurality of fourth openings 521, is formed overlying a fourth ARC layer 418. The fourth resist features 420a and the fourth openings 521 are formed by exposing and developing a fourth resist layer. In one embodiment, the fourth resist layer is a positive resist layer. In another embodiment, the fourth resist layer is a negative resist layer. Preferably, the fourth resist layer has the same tone as the first resist layer. The fourth resist layer is patterned with a fourth lithography process by using a fourth mask with a fourth predefined pattern and a lithography system. The fourth openings 521 may be defined to have a dimension same as to the third openings 421. The fourth openings 521 may be positioned either above the second openings 221 or above the first openings 121 to form a plurality of via holes between the third openings 421. The fourth lithography process may further include post-exposure baking, developing, and hard baking.

Figure 8:
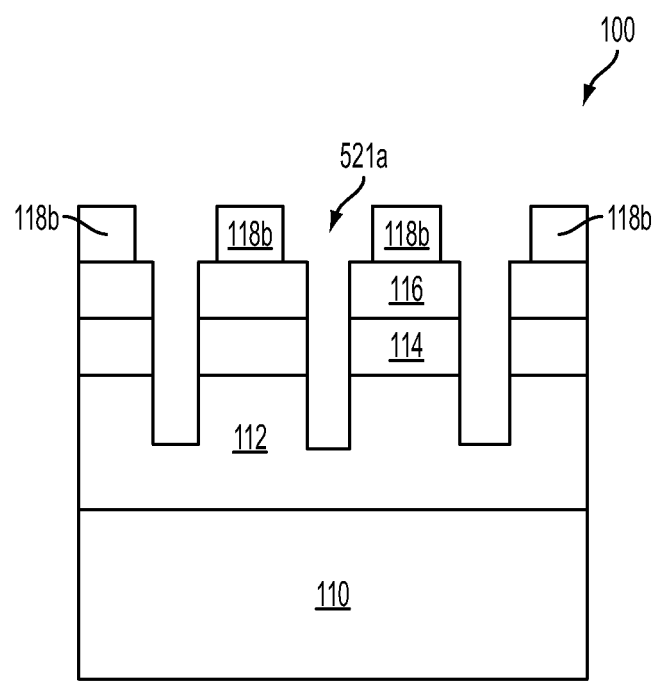

Referring to FIG. 8, a plurality of intermediate via holes 521a are formed in the material layer 112. The material layer 112 is partially removed through the fourth ARC layer 418, the second and the first etch stop layers 116, 114 by using the fourth resist features 420a as an etch mask. Each intermediate via hole 521a is positioned between two of the intermediate via holes 421a. The depth of the removed material layer 112 is designed to be substantial the same as the depth formed by the step 214. The fourth resist features 420a and the remaining fourth ARC layer 418 are then removed by implementing a wet stripping and/or plasma ashing known in the art.

Figure 9:
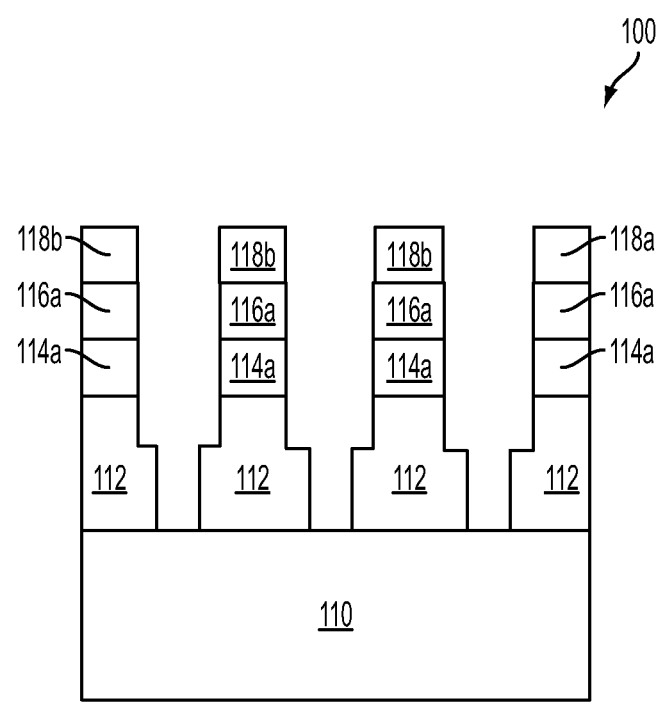

Referring to FIGS. 9 and 10, the method 200 proceeds to step 218 by etching the material layer 112 through the second and the first etch stop layer by using the final hard mask features 118b as an etch mask. The final hard mask features 118b may be partially or all removed during the etching process. Process of the etching is chosen such that the material layer 112 has an etch rate higher than that of the substrate 110. In one embodiment, the etching rate of the first etch stop layer 114 is between the etching rates of the second etch stop layer 116 and the material layer 112. In another embodiment, the etching rate of the first etch stop layer 114 is greater than the etching rate of the second etch stop layer 114, but less than the etching rate of the material layer 112. In other embodiment, the etching rate of the first etch stop layer 114 is less than the etching rate of the second etch stop layer 114, but greater than the etching rate of the material layer 112. Hence, an etched pattern with smooth and/or vertical sidewalls in the second and the first etch stop layers and the material layer 112 is achieved by the designed etching rates. Therefore, dual damascene structures are formed within the material layer 112. Each damascene structure has one trench line above one contact via hole.

The method described above with reference to FIGS. 1 to 10 provides a double patterning process constructed according to various aspects of the present disclosure. The manufacturing throughput and product quality are enhanced, compared with the conventional double patterning and double etching method. In another example, the method 200 is capable of etching a thicker film since the hard mask layer 118 can be properly chosen with a higher etch resistance.

Various embodiments of a lithography patterning method 200 have been introduced and described. Other modifications, variations, additions, and extensions may be used without departing from the scope of the disclosure. In one example, a plurality of contact holes are defined by the first positive and second positive resist patterns are formed in the material layer 112. Alternatively, a plurality of trenches may be defined by the first positive and second positive resist patterns are formed in the material layer 112. In another example, the BARC layer and/or mask layer may be eliminated. In another example, the positive and negative resist patterns are directly formed on the substrate 110.

The radiation beam used to expose the first and the second resist layers may be ultraviolet (UV) or EUV, such as a 248 nm beam from a Krypton Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. The optical exposing process may alternatively be implemented or replaced by other proper methods such as maskless lithography, electron-beam writing, ion-beam writing, and molecular imprint techniques. In another example, the first and second masks used in the method 200 may utilize other mask technologies. For example, the first pattern (or second mask pattern) may be formed in a phase shift mask (PSM). The phase shift mask can print better images than a binary mask.

In one embodiment, the positive resist pattern includes chemical amplifier (CA) resist. In another embodiment, the negative resist layer includes negative resist inert to acid. In furtherance of the embodiment, the negative resist layer includes cyclized synthetic rubber resin, bis-acrylazide, and aromatic solvent. In another embodiment, the positive resist may alternatively include novolac resin, diazonaphthoquinone (DNQ) as photoactive compound (PAC), and PGME (or PGMEA or ethyl lactate) as solvent. In another example, the negative resist includes silicon-containing material such that the negative resist has an etching resistance greater than that of the positive resist.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a material layer overlying a substrate, the material layer having a first carbon concentration;
   forming a first etch stop layer overlying the material layer, the first etch stop layer having a second carbon concentration;
   forming a second etch stop layer overlying the first etch stop layer, the second etch stop layer having a third carbon concentration, the second carbon concentration being larger than the first carbon concentration, but less than the third carbon concentration;
   providing a patterned mask layer overlying the second etch stop layer, the patterned mask layer having openings therein; and
   etching the second etch stop layer, the first etch stop layer, and the material layer using the patterned mask layer as an etch mask.

2. The method of claim 1, wherein the material layer, the first etch stop layer, and the second etch stop layer are oxide.

3. The method of claim 1, wherein the first, the second, and the third carbon concentrations are less than about 15%, ranging from about 15% to about 25%, and larger than about 25%, respectively.

4. The method of claim 1, wherein the material layer, the first etch stop layer, and the second etch stop have a first, a second, and a third etching rates, respectively, the second etching rate ranging between the first and the third etching rates.

5. The method of claim 4, wherein the second etching rate is greater than the third etching rate, but less than the first etching rate.

6. The method of claim 1, wherein the material layer comprises fluorinated silica glass, carbon doped silicon oxide, Black Diamond®, Xerogel, Aerogel, amorphous fluorinated carbon, Parylene, bisbenzocyclobutenes, SiLK™, polyimide, or a combination thereof.

7. The method of claim 1, wherein the first etch stop layer comprises silicon oxycarbide, silicon oxide, tetraethyl orthosilicate, carbon-doped oxide, or a combination thereof.

8. The method of claim 1, wherein the second etch stop layer comprises silicon oxycarbide, silicon oxide, tetraethyl orthosilicate, carbon-doped oxide, or a combination thereof.

9. The method of claim 1, wherein the providing the patterned mask layer further comprises:
forming the mask layer on the second etch stop layer;
forming an anti-reflective coating on the mask layer;
forming a resist coating over the anti-reflective coating;
patterning the resist coating;
patterning the anti-reflective coating, the patterned anti-reflective coating aligning with the patterned resist coating; and
patterning the mask layer, the patterned mask layer aligning with the patterned anti-reflective coating.

10. A method comprising:
forming a material layer overlying a substrate;
forming a first etch stop layer overlying the material layer;
forming a second etch stop layer overlying the first etch stop layer;
providing a patterned mask layer overlying the second etch stop layer, the patterned mask layer having openings therein; and
etching the material layer through the second and the first etch stop layers by using the patterned mask layer as an etch mask, wherein the material layer, the first etch stop layer, and the second etch stop layers are dielectric layers having a first, a second, and a third carbon concentrations, respectively, the second carbon concentration being greater than the first carbon concentration but less than the third carbon concentration.

11. The method of claim 10, wherein the material layer, the first etch stop layer, and the second etch stop have a first, a second, and a third etching rates, respectively, the second etching rate ranging between the first and the third etching rates.

12. The method of claim 11, wherein the second etching rate is greater than the third etching rate, but less than the first etching rate.

13. The method of claim 10, wherein the first, the second, and the third carbon concentrations are less than about 15%, ranging from about 15% to about 25%, and larger than about 25%, respectively.

14. A method of patterning, comprising:
forming a dielectric layer overlying a substrate;
forming a first oxide layer overlying the dielectric layer;
forming a second oxide layer overlying the first oxide layer;
forming a patterned hard mask layer overlying the second oxide layer, the patterned hard mask layer having a plurality of trenches therein;
forming a resist pattern overlying the patterned hard mask layer, the resist pattern having a plurality of via holes therein;
partially etching the dielectric layer through the second and the first oxide layers using the resist pattern as an etch mask;
removing the resist pattern; and
etching the dielectric layer through the second and the first oxide layers using the patterned hard mask layer as an etch mask, wherein the second oxide layer, the first oxide layer, and the dielectric layer have a first, a second, and a third etching rates, respectively, the second etching rate being between the first and the third etching rates, and wherein the second oxide layer, the first oxide layer, and the dielectric layer have a first, a second, and a third carbon concentrations, respectively, the second carbon concentration being greater than the third carbon concentration but less than the first carbon concentration.

15. The method of claim 14, wherein the first, the second, and the third carbon concentrations are larger than about 25% ranging from about 15% to about 25%, and less than about 15%, respectively.

16. The method of claim 14, wherein the dielectric layer comprises fluorinated silica glass, carbon doped silicon oxide, Black Diamond®, Xerogel, Aerogel, amorphous fluorinated carbon, Parylene, bisbenzocyclobutenes, SiLK™, polyimide, or a combination thereof.

17. The method of claim 14, wherein the first oxide layer comprises silicon oxycarbide, silicon oxide, tetraethyl orthosilicate, carbon-doped oxide, or a combination thereof.

18. The method of claim 14, wherein the second oxide layer comprises silicon oxycarbide, silicon oxide, tetraethyl orthosilicate, carbon-doped oxide, or a combination thereof.

* * * * *